United States Patent [19]

Bukhman

[11] Patent Number: 5,116,460
[45] Date of Patent: May 26, 1992

[54] METHOD FOR SELECTIVELY ETCHING A FEATURE

[75] Inventor: Yefim Bukhman, Scottsdale, Ariz.

[73] Assignee: Motorola, Inc., Schaumburg, Ill.

[21] Appl. No.: 684,130

[22] Filed: Apr. 12, 1991

[51] Int. Cl.$^5$ .................... B44C 1/22; B29C 37/00
[52] U.S. Cl. .................... 156/643; 156/649;
  156/651; 156/657; 156/659.1; 156/668;
  156/646
[58] Field of Search ............. 156/643, 646, 649, 651,
  156/652, 653, 655, 657, 659.1, 662, 668;
  204/192.32, 192.36, 192.37; 437/228, 235, 238,
  241

[56] References Cited

U.S. PATENT DOCUMENTS

| | | | |
|---|---|---|---|
| 4,604,162 | 8/1986 | Sobczak | 156/649 X |
| 4,657,630 | 4/1987 | Agatsuma | 156/643 |
| 4,661,374 | 4/1987 | Doering | 156/652 X |
| 4,805,683 | 2/1989 | Magdo et al. | 156/643 |
| 4,818,714 | 4/1989 | Haskell | 156/652 X |
| 4,838,991 | 6/1989 | Cote et al. | 156/643 |

Primary Examiner—William A. Powell
Attorney, Agent, or Firm—Joe E. Barbee

[57] ABSTRACT

A method is provided for selectively etching materials on a semiconductor wafer (10, 30) that have similar etch rates. The semiconductor wafer (10, 30) is provided with at least a first layer. An etch mask is provided on the first layer. The layer with the etch mask (13) is partially etched to a predetermined point. A polymer film (21, 38) is deposited on the partially etched layer. The polymer film (21, 38) is etched in an anisotropic manner creating open or clear areas (14, 34) in the horizontal polymer film, while leaving polymer coating (22, 37) on vertical walls (12, 36). The open areas (14, 34) are chemically etched, while the remaining polymer coating (22, 37) on the vertical walls (12, 36) protects the vertical walls (12, 36) from being chemically etched. This method also protects the top surface of the semiconductor wafer.

19 Claims, 1 Drawing Sheet

METHOD FOR SELECTIVELY ETCHING A FEATURE

BACKGROUND OF THE INVENTION

This invention relates, in general, to manufacturing semiconductor products, and more particularly to etching features used in semiconductor devices for semiconductor products.

Generally, etching is a pattern transfer process that has been used in manufacturing semiconductor devices for a long time. Basically, the process requires that a masking layer be defined with a pattern. The masking layer is placed over or on top of a film that the pattern is to be transferred into. The film is then removed or etched away from around the masking layer, leaving an identical pattern that was previously defined by the masking layer in the etched film. Additionally, some features can also be fabricated by etching whole films without the use of the masking layer.

A large portion of etching of semiconductor devices is achieved conventionally by using gaseous plasma processes. These plasma processes are generally known as plasma etching. By selecting appropriate process conditions, the gaseous plasma can be made to be a predominantly chemical process, a predominantly physical process or a combination of both chemical and physical processes. Selecting either a predominantly chemical process or a predominantly physical process, results in different structural effects in the etched film. Chemical processes etch in an isotropic manner and do not exhibit dimensional control, whereas physical processes etch in an anisotropic manner and do exhibit dimensional control. Further, chemical or isotropic etching processes generally do not damage an underlying layer or a substrate which is beneath the layer that is being etched; however, anisotropic etching processes typically use high potential plasmas which do damage the underlying layer or substrate beneath the layer that is being etched.

Additionally, by adjusting the process conditions of the gaseous plasma, process parameters, such as etch rate and selectivity, can be adjusted and changed. Etch rate or removal rate is a parameter that indicates a speed at which a material is being removed. Selectivity is the etch rate or the removal rate of two or more materials that are compared to each other for a given set of plasma conditions. Until recently, adjustment of the gaseous plasma to either a predominantly chemical process or a predominantly physical process was sufficient to obtain desired results in regards to structural effects, etch rates, and selectivities.

However, as semiconductor products have become more complicated and etch requirements have become more stringent, several problems have occurred with achieving the desired selectivities, while maintaining desired structural effects. One problem occurs when a highly selective etch is required between two materials that etch at similar etch rates, and are etched simultaneously. By using conventional adjustment methods, it is not possible to etch these materials with high selectivity and with dimensional control. Not being able to achieve these requirements, makes it impossible to manufacture some structures or degrades the semiconductor device that are manufactured.

Additionally, problems of dimensional control and damage to an underlying layer or substrate are exacerbated when plasma etching of features with high aspect ratios, such as when fabricating sidewall spacers. By using conventional methods, it is not possible to etch features with high aspect ratios and still maintain dimensional control, high selectivity, and low damage to underlying structures.

Therefore, a method to achieve highly selective etches and to have a greater dimensional control would be very desirable. Additionally, having a method that protects the semiconductor device from radiation damage or etch damage from energetic ions would also be desirable.

SUMMARY OF THE INVENTION

Briefly, according to the invention, a method is provided for etching materials selectively that have similar etch rates on a semiconductor wafer. The semiconductor wafer is provided with a first and a second layer. An etch mask is provided on the second layer, which is partially etched to a predetermined point. A polymer film is deposited on the partially etched second layer. The polymer film is etched in an anisotropic manner creating open or clear areas in the polymer film, while leaving some of the polymer film on walls of the partially etched second layer. The open areas are chemically etched, while the remaining polymer on the vertical walls protects the vertical walls from being chemically etched.

DETAILED DESCRIPTION OF THE DRAWINGS

Figure 1A:
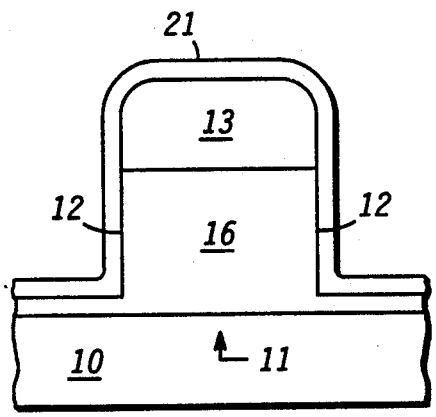
FIG. 1A and FIG. 1B illustrate a cross-sectional view of a portion of a semiconductor device in various stages of practicing the present invention.

FIG 1A is a cross-sectional view of a portion of a semiconductor substrate 10 with a partially etched feature 11 that is covered by a polymer coating 21. It should be understood that only a small portion of semiconductor 10 is shown and that many more features, such as feature 11, can be on semiconductor substrate 10. It should be further understood that feature 11 was formed from a first layer on semiconductor substrate 10; however, substrate 10 could just as well have been a second layer of material. For illustrative purposes only, use of semiconductor substrate 10 was chosen. A first layer of material is either deposited or grown on semiconductor substrate 10 by using methods known in the art. The first layer can be made of many different kinds of materials, such as dielectrics, conductors, III-V semiconductor materials, or other semiconductor materials. In a preferred embodiment, the first layer is a dielectric, such as silicon dioxide. The first layer is not shown in FIG. 1A as a continuous layer, however the first layer is shown as a partially etched feature 11 with thin areas 16. Conventionally, an anisotropic etch is used to maintain dimensional control or transfer the width of the pattern into the layer or the substrate that is being etched. Typically, in order to achieve this transfer, a high energy plasma that etches in a vertical direction is used. The first layer is patterned by well-known methods in the art.

In the present invention, the first layer is only partially etched forming feature 11 on semiconductor substrate 10. Feature 11 is etched by an anisotropic plasma etching process, thereby, yielding vertical or near vertical sidewalls 12 with a width that is similar or the same as the width of etch mask 13. Additionally, by anisotropic or directional etching very little or no damage is done to sidewalls 12, because of the vertical nature of anisotropic etching. It is also important to realize that the first layer is only partially etched to completion and that a thin layer 16 still remains. By not etching thin layer 16 to completion, surface 19 is protected from ion bombardment and radiation damage which normally occurs with conventional anisotropic plasma etching methods that would etch the first layer to completion. The ion bombardment and radiation damage that some substrates, such as silicon, sustain during conventional etching using energetic ions makes these exposed substrates unsuitable or marginal for building devices on. Typically, in the present invention, the first layer is etched to a predetermined depth that is approximately 85 percent to 95 percent completion; however, the percent completion or desired stopping point is dependent upon uniformity of the anisotropic etching process. Knowing when to stop etching of the first layer can be achieved by many methods, such as time, laser interferometry, or other end-point detection methods.

After partial etching of feature 11 is completed, a conformal polymer coating 21 is deposited onto partially etched feature 11 and all associated exposed surfaces on semiconductor substrate 10. Generally, this deposition is achieved by changing plasma chemistry from an etching mode to a conformal polymer deposition mode. However, it should be realized that even though it is preferred to deposit polymer coating 21 in the same reactor that was used to etch feature 11, it is also possible to achieve deposition of polymer coating 21 in another reactor. There is a variety of reaction chemicals and plasma conditions that can create polymer coating 21. Typically, these chemicals are fluorocarbons that are reacted at relatively high pressures and low powers. Solely, for illustrative purposes, examples used in FIG. 1A will be limited to having semiconductor substrate 10 being made of silicon, and feature 11, that was fabricated from the first layer, being made of silicon dioxide. It should be understood that other substrates and other layers and features could also be used.

By way of example, polymer coating 21 is deposited on all exposed surfaces of semiconductor substrate 10 to an approximate thickness between 500 angstroms to 1,500 angstroms. This deposition typically is accomplished with a plasma made of fluorocarbon gases, such as $CHF_3$, $C_2H_2F_2$, or the like. Plasma conditions typically are between 250 watts to 1,500 watts, with chamber pressures that are between 100 millitorr to 1.5 torr.

Figure 1B:
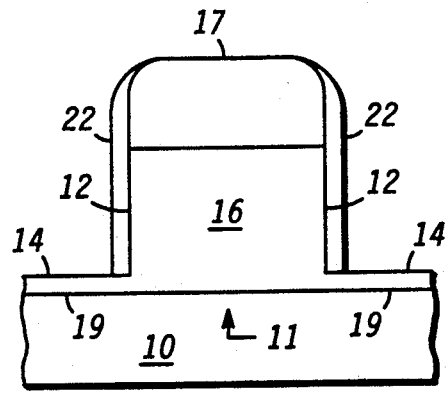

FIG. 1B is a cross-sectional view of a portion of semiconductor substrate 10, with partially etched feature 11 that has had horizontal portions of polymer coating 21 etched away by an anisotropic etch. By etching conformal polymer coating 21 in an anisotropic manner all horizontal surfaces that were covered by conformal polymer 21 are etched away, thus exposing surfaces 14 and 17. By way of example, polymer coating 21 is etched typically in an anisotropic manner in a plasma that oxidizes conformal polymer coating 21 into volatile gases. Oxidation plasma chemistries can be created by gases, such as oxygen. Generally, anisotropic conditions are achieved by using low pressures and high powers. Typical ranges of pressure are between 1.0 millitorr to 200 millitorr, with powers ranging between 500 watts to 1,500 watts. Etching away exposed horizontal surfaces of conformal polymer 21, shown in FIG. 1A, results in exposing silicon dioxide surfaces 14 and photoresist surface 17, while protecting silicon dioxide sidewalls 12 with polymer coating 22.

Additionally, sidewalls 12 are still covered by a polymer coating 22 that was part of conformal polymer coating 21. By having sidewalls 12 covered by polymer coating 22, protection is given to sidewalls 12. Exposed horizontal surfaces 14 are now capable of being chemically etched without affecting sidewalls 12 and damaging surface 19. Typically, etching of surface 14 is achieved by an isotropic or a chemical means; therefore, etching of thin layer 16 is achieved vertically and horizontally at equal rates. However, since sidewalls 12 are protected by polymer coating 22 and the thickness of thin layer 16 is small, complete etching or removal of thin layer 16 affects feature 11 only slightly or not at all. Additionally, by chemically etching away thin layer 16 damage to semiconductor substrate 10 itself is prevented. Therefore, removal or etching away of thin layer 16 can be accomplished without damaging sidewalls 12 and without damaging substrate 10.

Isotropic or chemical etching can be achieved either by dry plasma etching or by wet chemical etching. In this particular case, a wet chemical etch of dilute aqueous hydrofluoric acid would be preferred for removing the thin oxide layer 16. By etching thin oxide layer 16 away with dilute aqueous hydrofluoric acid, a semiconductor device quality silicon substrate 19 is exposed. Since silicon substrate 19 has not been directly exposed to any ion bombardment or radiation from the anisotropic gaseous plasma, damage that would have been caused by such does not occur in the present invention.

Once removal of thin layer 16 is accomplished, normal conventional methods and techniques can be used to remove remaining polymer 22 in an isotropic or chemical manner, such as a hydrogen peroxide and sulfuric acid solution, or an oxygen plasma.

Figure 2A:
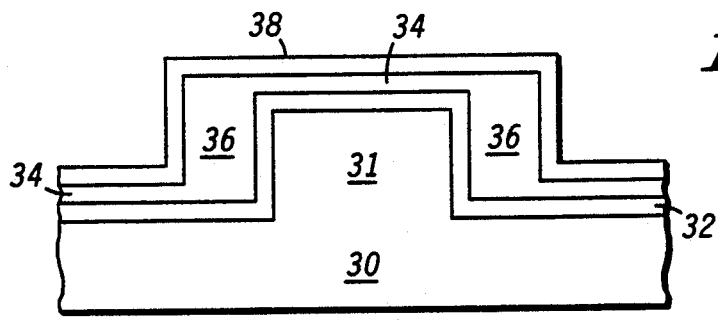
FIG. 2A and FIG. 2B illustrate a cross-sectional view of a portion of a semiconductor device in various states of practicing the present invention in another embodiment.

FIG. 2A is a cross-sectional view of a portion of a semiconductor substrate 30 with several structural layers 32 and 34 on an etched feature 31. Layer 34 and sidewalls 36 originated from a thick conformal layer that was etched. Layers 32 and 34 are used to fabricate sidewalls 36 around feature 31. Etched feature 31 can be fabricated by many methods known in the semiconductor art. Etch feature 31 can be made of many different kinds of materials used in fabricating semiconductor devices, such as silicon, polysilicon, III–V semiconductor materials, metals, and metal alloys. Etch feature 31 is covered by a conformal thin layer 32, which is either deposited or grown over etched feature 31. Thin layer 32 can also be made of several materials, such as oxide or nitride. Subsequently, a thick conformal film is deposited on conformal thin layer 32. Additionally, the thick conformal layer can also be made of several materials, such as oxide or nitride. Both thin conformal layer 32 and the thick conformal film are made by using known methods in the art.

In the present invention, the thick conformal film is etched to a predetermined depth that is approximately 85 to 95 percent completion; however, the percent completion or desired stopping point is dependent upon uniformity of the anisotropic etching process. This etch is achieved in a uniform vertical manner without a mask. By etching the thick conformal film by an anisotropic manner, horizontal areas 34 are thinned, while vertical or sidewalls 36 remain approximately the same thickness as the thick conformal layer before etching. Knowing when to stop the thick nitride etch can be achieved by many methods, such as time, laser interferometry, or end-point detection. After etching the original thick conformal film in an anisotropic manner, a polymer coating 38 is deposited in a conformal manner over the entire etched surface.

Polymer coating 38 is deposited in a plasma reactor in the same manner as polymer coating 21 discussed previously in FIG. 1A.

For the sake of simplicity, examples used to illustrate the present invention will be of a single structure. The use of the single structure by no means is intended to limit the many possible materials in the present invention. The single structure will have feature 31 being made of silicon, thin conformal layer 32 being made of oxide, and a thick conformal layer (now thin layer 34 and sidewall 36 being made of silicon nitride. Typically, thin oxide layer 32 and thick nitride film have thickness ranges between 50 angstroms to 300 angstroms and 3,000 angstroms and 5,000 angstroms respectfully.

Figure 2B:
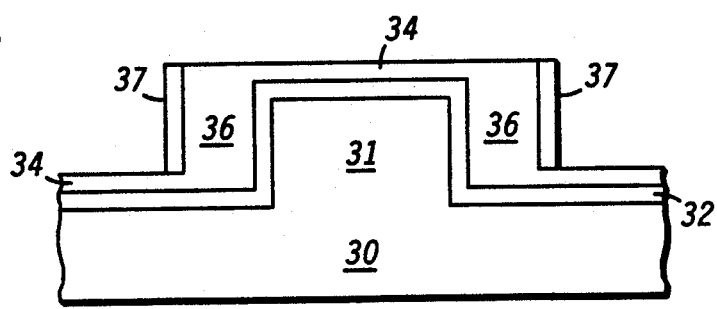

FIG. 2B is a cross-sectional view of a portion of semiconductor substrate 30, with partially etched feature 11 that has had the horizontal portions of polymer coating 38 etched away by an anisotropic means. By having polymer 38 etched in an anisotropic manner, horizontal surfaces are etched cleanly and are free of polymer 38, while leaving a portion of polymer 38, shown as polymer 37 to protect sidewalls 36. This protection allows for further processing to remove thin material areas 34, which are now capable of being etched away by using chemical or isotropic etching methods. Chemical or isotropic etches can be either dry plasma etches or wet chemical etches depending upon what materials are to be removed. Using a low energy gaseous plasma, a predominantly chemical plasma, either avoids or abates damage to the underlying layers by not having high energy ions bombarding thin materials 34 and eventually layer 32. Therefore, use of chemical or isotropic etches, which include both wet and gaseous plasmas can be selected depending upon materials that are to be etched away. Further, by having protected the sidewalls 36 by polymer 37, thin material areas 34 can now be removed without damaging thin layer 32 and without loss of dimensional control of sidewalls 36. Conventionally, in order to etch the thick film without damaging thin layer 32 and without loss of dimensional control of sidewalls 36, process conditions would be adjusted to the very best selectivity; however, if sidewalls 36, thin material area 34, and thin film 32 all etch at similar rates, adjustment of the process conditions cannot cause the desired effect of increasing the selectivity. Additionally, protecting sidewalls 36 with polymer coating 37 allows for etching of thin material 34 in an isotropic manner without affecting sidewall 36 dimensional control.

Typically, removal of the horizontal areas of polymer 38 is achieved by exposing the horizontal areas of polymer 38 to an oxidizing plasma with an anisotropic nature. This plasma is achieved by using oxidizing gases, such as oxygen. Typical process conditions for such a plasma would have pressures between 1.0 millitorr to 200 millitorr and power ranges between 500 watts to 1,500 watts.

By having the anisotropic oxidizing plasma remove horizontal polymer area 38, exposes thin silicon nitride areas 34 that are ready for removal by chemical or isotropic etching methods. Using chemical or isotropic etching methods to remove thin silicon nitride areas 34 ensures that removal is achieved without damaging oxide layer 32. Additionally, polymer 37 protects sidewalls 36 while isotropic etching of thin layer 32. In this particular example, it is preferred that a dry chemical or isotropic plasma etch be used to remove thin silicon nitride areas 34. The dry chemical plasma typically uses a fluorocarbon plus an oxygen gas mixture in a reactor. The fluorocarbon reacts with thin silicon nitride to form volatile gas species, while the oxygen reacts and removes polymer that is deposited by the fluorocarbon. Even though some of polymer 37 may be etched by the gas mixture, it should be understood that the thickness of polymer 37 that was deposited previous to etching of silicon nitride areas 34, is thick enough to withstand this slight etching while thin silicon nitride areas 34 are removed. Additionally, in this particular example, chemical or isotropic etch rates of silicon nitride and oxide are considerably different, with silicon nitride etching much faster than silicon dioxide. However, anisotropic etch rates of silicon nitride and silicon dioxide are quite similar. Therefore, using a chemical or isotropic etching method to remove thin nitride areas 34, results in a selective etch and that does not expose oxide layer 32 to a high energy anisotropic plasma. By etching with an isotropic plasma it should be understood that etching occurs in all directions at the same rate. Additionally, by using an isotropic etching means, damage to thin layer 32 is negligible. Therefore, since thin silicon nitride layer 32 is between 250 angstroms to 750 angstroms in thickness, only a very small amount, if any, is going to be removed from under sidewall 36.

After etching of horizontal surface 34 is complete, removal of remaining polymer 37 is achieved by normal conventional methods, such as wet chemical stripping with hydrogen peroxide and sulfuric acid, or an oxygen plasma.

In FIG. 1A and FIG. 1B a method is described that allows for etching of feature 11 while maintaining control of width dimensions and not damaging fragile surface 19. FIG. 2A and FIG. 2B a similar method is described except that multiple layers have been either deposited or grown over an already existing feature 31, so that sidewalls 36 can be fabricated.

By now it should be appreciated that there has been provided a method for selectively etching features into materials with similar etch rates without damaging the underlying surface or substrate, as well as controlling critical dimensions. Additionally, a method is provided for etching sidewall spacers of high aspect ratios with high selectivity with materials that ordinarily have low selectivity.

I claim:

1. A method for selectively etching a feature in layers having similar anisotropic etch characteristics on a semiconductor wafer comprising:
   providing a semiconductor wafer with a first and a second layer;
   providing an etch mask on the second layer, which defines the second layer into open areas and covered areas that are protected by the etch mask;
   etching the open areas of the second layer partially until a predetermined amount of the open areas is removed;
   depositing a polymer film over the partially etched open areas and the covered areas;

anisotropic etching of the polymer film, leaving walls of the etched open areas protected by the polymer film while the other areas are etched clear of polymer; and chemically etching the open areas that are clear of polymer.

2. The method of claim 1 further comprising using a dry chemical means for chemically etching the open areas that are clear of the polymer film.

3. The method of claim 1 further comprising using a wet chemical means for chemically etching the open areas that are clear of the polymer film.

4. The method of claim 1 further comprising depositing the polymer film in situ.

5. The method of claim 1 wherein etching of the second layer, depositing of the polymer film, anisotropic etching of the polymer film, and chemically etching of the open areas is accomplished in one system.

6. A method for selectively etching a first layer over a semiconductor substrate comprising:

providing the semiconductor substrate with a first layer that has at least one etch mask defined on the first layer;

etching the first layer in an anisotropic manner until a predetermined depth in the first layer is reached, thereby producing at least one wall;

covering the etch mask, the first layer that has been partially etched to the predetermined depth, and the at least one wall with polymer film;

anisotropic etching of the polymer film so that areas are formed that are cleared of the polymer film, exposing the partially etched first layer and leaving the polymer film on the at least one sidewall; and etching the first layer that has been partially etched with an isotropic chemistry that is selective to the semiconductor substrate.

7. The method of claim 6 further comprising having the semiconductor substrate be silicon and having the first layer be silicon dioxide.

8. The method of claim 6 further comprising using photoresist for the etch mask.

9. The method of claim 6 further comprising using either a wet or dry isotropic chemistry for etching the first layer that has been partially etched.

10. The method of claim 6 wherein etching of the first layer, covering with the polymer film, anisotropic etching of the polymer film, and chemical etching of the clear areas is accomplished in one system.

11. The method of claim 6 further comprising removal of remaining polymer film by a wet or dry means.

12. A method for making a sidewall spacer on a semiconductor wafer comprising:

providing a feature with at least one sidewall on a semiconductor wafer;

providing a first conformal layer on the feature and on the sidewall;

etching the first conformal layer in an anisotropic manner until a predetermined amount of the first layer is removed;

depositing a polymer film on the first etched layer and on the sidewall;

etching the polymer film in an anisotropic manner, thereby removing portions of the polymer film, which creates open areas and leaves the polymer film on the sidewall of the etched first layer; and etching open areas of exposed etched first layer by chemical means until the exposed first layer is completely etched away and leaving the polymer coated sidewall.

13. A method of selectively etching a semiconductor wafer comprising:

providing a feature with at least one sidewall on a semiconductor wafer;

providing a first conformal layer that covers the feature and the sidewall forming a second sidewall;

providing a second conformal layer that is deposited on the first layer;

etching the second layer in anisotropic manner until a pre-determined amount of the second layer is removed;

depositing a polymer coating on the second etched layer;

etching in an anisotropic manner the polymer coating, thereby removing the polymer coating in open areas and leaving the polymer coating on the sidewall; and etching the second layer until completion and leaving the polymer coated sidewalls.

14. The method of claim 13 wherein the first and second conformal layers are a conformal oxide layer and a conformal nitride layer respectively and that are adjusted to a thickness between 50 angstroms to 500 angstroms and to between 1,500 angstroms to 3,000 angstroms respectively.

15. The method of claim 14 further comprising providing a conformal oxide layer that is substantially adjusted to a thickness of 100 angstroms 16. The method of claim 14 further comprising providing a conformal nitride layer that is substantially adjusted to a thickness of 3,000 angstroms.

17. The method of claim 13 wherein the polymer coating has a thickness between 500 angstroms to 1,000 angstroms.

18. The method of claim 17 wherein the polymer coating is substantially adjusted to a thickness of 750 angstroms.

19. A method of selectively etching at least a first layer on a substrate comprising:

etching selective areas of the first layer with a high energy plasma etch to form at least one side wall;

stopping short of etching through the first layer;

covering the first layer and the at least one side wall with a polymer film;

anisotropically etching all horizontal surfaces of the polymer film to leave the polymer film of the at least one sidewall;

isotropically etching the remainder of the first layer not covered by the polymer film; and removing the polymer film, thereby exposing the at least one sidewall.

* * * * *